US009691920B2

(12) United States Patent
Casse (10) Patent No.: US 9,691,920 B2
(45) Date of Patent: *Jun. 27, 2017

(54) METAMATERIAL ENHANCED THERMOPHOTOVOLTAIC CONVERTER

(71) Applicant: Palo Alto Research Center Incorporated, Palo Alto, CA (US)

(72) Inventor: Bernard D. Casse, Saratoga, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/149,997

(22) Filed: May 9, 2016

(65) Prior Publication Data
US 2016/0254396 A1    Sep. 1, 2016

Related U.S. Application Data

(62) Division of application No. 14/180,341, filed on Feb. 13, 2014.

(51) Int. Cl.
*H01L 31/0232* (2014.01)
*B82Y 40/00* (2011.01)
(Continued)

(52) U.S. Cl.
CPC ........ *H01L 31/02322* (2013.01); *B82Y 40/00* (2013.01); *G02B 5/008* (2013.01);
(Continued)

(58) Field of Classification Search
CPC .................................................. H01L 31/054
(Continued)

(56) References Cited

U.S. PATENT DOCUMENTS

| 1,111,239 A | 9/1914 | Smelser |
| 2,712,772 A | 7/1955 | Trombe |

(Continued)

FOREIGN PATENT DOCUMENTS

| CN | 101227158 A | 7/2008 |
| DE | 3205439 A1 | 8/1983 |

(Continued)

OTHER PUBLICATIONS

Currie et al. "High-Efficiency Organic Solar Concentrators for Photovoltaics", Science 321 (2008), pp. 226-228.
(Continued)

*Primary Examiner* — Devina Pillay
*Assistant Examiner* — Daniel Malley, Jr.
(74) *Attorney, Agent, or Firm* — Bever, Hoffman & Harms, LLP (57) ABSTRACT

A thermophotovoltaic (TPV) converter includes spectrally-selective metamaterial emitters disposed on peripheral walls of an all-metal box-like enclosure, and associated photovoltaic (PV) cells configured to efficiently convert in-band photons having optimal conversion spectrums into electricity. The peripheral walls surround a substantially rectangular interior cavity having an inlet opening through which heat energy (e.g., concentrated sunlight) is supplied, and an outlet opening through which waste heat exits the cavity. Concentrated sunlight passing through the box-like enclosure heats the peripheral walls to a high temperature (i.e., above 1000° K), causing thermally excited surface plasmons generated on the emitters' concentric circular ridges to produce highly-directional radiant energy beams having a peak emission wavelength roughly equal to a fixed grating period separating the ridges. The metamaterial emitter is optionally provided with multiple bull's eye structures in a multiplexed (overlapping) pattern and with different grating periods to (Continued)

produce a broad emission spectrum overlapping the optimal conversion spectrum.

7 Claims, 8 Drawing Sheets

(51) Int. Cl.
| | |
|---|---|
| G02B 5/00 | (2006.01) |
| H02S 10/30 | (2014.01) |
| H02S 40/22 | (2014.01) |
| H02S 30/10 | (2014.01) |
| H01L 31/054 | (2014.01) |
| B82Y 20/00 | (2011.01) |
| B82Y 30/00 | (2011.01) |

(52) U.S. Cl.
CPC .... *H01L 31/02325* (2013.01); *H01L 31/0549* (2014.12); *H02S 10/30* (2014.12); *H02S 30/10* (2014.12); *H02S 40/22* (2014.12); *B82Y 20/00* (2013.01); *B82Y 30/00* (2013.01); *Y02E 10/52* (2013.01)

(58) Field of Classification Search
USPC ........................................................ 136/246
See application file for complete search history.

(56) References Cited

U.S. PATENT DOCUMENTS

| | | | |
|---|---|---|---|
| 2,913,583 | A | 11/1959 | Regnier et al. |
| 3,861,379 | A | 1/1975 | Anderson, Jr. |
| 3,892,433 | A | 7/1975 | Blake |
| 3,905,352 | A | 9/1975 | Jahn |
| 3,923,381 | A | 12/1975 | Winston |
| 3,924,604 | A | 12/1975 | Anderson |
| 4,068,653 | A | 1/1978 | Bourdon et al. |
| 4,109,638 | A | 8/1978 | Matlock et al. |
| 4,110,009 | A | 8/1978 | Bunch |
| 4,110,010 | A | 8/1978 | Hilton |
| 4,110,123 | A | 8/1978 | Goetzberger et al. |
| 4,114,596 | A | 9/1978 | Chang et al. |
| 4,117,682 | A | 10/1978 | Smith |
| 4,130,109 | A | 12/1978 | Brueck |
| 4,148,301 | A | 4/1979 | Cluff |
| 4,149,902 | A | 4/1979 | Mauer et al. |
| 4,153,813 | A | 5/1979 | Blieden et al. |
| 4,190,465 | A | 2/1980 | Boling |
| 4,193,819 | A | 3/1980 | Wohlmut |
| 4,209,231 | A | 6/1980 | Sayre |
| 4,218,114 | A | 8/1980 | Bunch |
| 4,234,352 | A * | 11/1980 | Swanson .................... F24J 2/07 136/253 |
| 4,261,335 | A | 4/1981 | Balhorn |
| 4,266,530 | A | 5/1981 | Steadman |
| 4,440,153 | A | 4/1984 | Melchior |
| 4,771,764 | A | 9/1988 | Cluff |
| 4,935,631 | A | 6/1990 | Mosley et al. |
| 5,180,441 | A | 1/1993 | Cornwall et al. |
| 5,274,497 | A | 12/1993 | Casey |
| 5,816,238 | A | 10/1998 | Burns et al. |
| 6,239,353 | B1 | 5/2001 | Hall et al. |
| 6,820,611 | B2 | 11/2004 | Kinoshita |
| 6,953,038 | B1 | 10/2005 | Nohrig |
| 7,192,146 | B2 | 3/2007 | Gross et al. |
| 7,677,241 | B2 | 3/2010 | Hickerson |
| 7,706,030 | B2 | 4/2010 | Herloski et al. |
| 8,354,628 | B2 | 1/2013 | Schmaelzle et al. |
| 2002/0179138 | A1 | 12/2002 | Lawheed |
| 2003/0016539 | A1 | 1/2003 | Minano et al. |
| 2003/0051750 | A1 | 3/2003 | Lawheed |
| 2007/0137690 | A1 | 6/2007 | Bruning et al. |
| 2007/0137691 | A1 | 6/2007 | Cobb et al. |
| 2008/0308154 | A1 | 12/2008 | Cart et al. |
| 2009/0038608 | A1 | 2/2009 | Caldwell |
| 2009/0126778 | A1 | 5/2009 | Brounne et al. |
| 2009/0205701 | A1 | 8/2009 | Govaerts et al. |
| 2009/0235974 | A1 | 9/2009 | Mapel et al. |
| 2010/0051016 | A1 | 3/2010 | Ammar |
| 2010/0110430 | A1 * | 5/2010 | Ebbesen ................ B82Y 20/00 356/331 |
| 2010/0252027 | A1 | 10/2010 | Sankrithi |
| 2011/0000543 | A1 | 1/2011 | Errico |
| 2011/0079267 | A1 | 4/2011 | Raymond et al. |
| 2011/0284059 | A1 | 11/2011 | Celanovic |
| 2012/0031467 | A1 | 2/2012 | Schmaelzle et al. |
| 2012/0161600 | A1 * | 6/2012 | Norris .................... B81C 99/009 313/11 |
| 2012/0192917 | A1 | 8/2012 | Whitted et al. |
| 2012/0325313 | A1 | 12/2012 | Cheung et al. |
| 2012/0325314 | A1 | 12/2012 | Cheung et al. |
| 2013/0047609 | A1 | 2/2013 | Schmaelzle et al. |
| 2013/0047977 | A1 | 2/2013 | Schmaelzle et al. |
| 2015/0228827 | A1 * | 8/2015 | Casse ...................... H02S 10/30 136/253 |

FOREIGN PATENT DOCUMENTS

| | | |
|---|---|---|
| DE | 3633172 A1 | 4/1988 |
| EP | 0575797 A1 | 12/1993 |
| WO | 2007109901 A1 | 10/2007 |
| WO | 2010033859 A2 | 3/2010 |
| WO | 2011012545 A1 | 2/2011 |
| WO | 2011148307 A2 | 12/2011 |

OTHER PUBLICATIONS

Dersch et al. "Trough integration into power plants-a study on the performance and economy of integrated solar combined cycle systems", Energy, vol. 29, Issues 5-6, Apr.-May 2004, pp. 947-959.
Goetzberger et al. "Photovoltaic materials, history, status and outlook", Materials Science and Engineering R 40 (2003), pp. 1-46.
Jones et al. "Rotating Field Collector Subsystem Study and Evaluation", Sandia Contractor Report, 1982, 144 pages.
Kolb et al. "Heliostat Cost Reduction Study", Sandia National Laboratory, Sandia Report SAND2007-3293, Jun. 2007, 159 pages.
Meyer: "Photon Transport in Fluorescent Solar Collectors", Thesis for the degree of Doctor of Philosophy, School of Engineering Sciences, University of Southampton, Jul. 2009, 197 pages.
Murphy, Jr. "Home photovoltaic systems for physicists", Physics Today, Jul. 2008, pp. 42-47.
Schramek et al. "Heliostats for maximum ground coverage", Energy 29 (2004), pp. 701-713.
Smestad et al. "The thermodynamic limits of light concentrators", Solar Energy Materials 21 (1990), pp. 99-111.
Weber et al. "Luminescent greenhouse collector for solar radiation", Applied Optics, vol. 15, No. 10, Oct. 1976, pp. 2299-2300.
Parc, "Large Area Micro-optics for Solar Energy", Feb. 20, 2013, 1 page.
Chen et al. "Design of tungsten complex gratings for thermophotovoltaic radiators," Optics Communications 269 (2007), pp. 411-417.

* cited by examiner

METAMATERIAL ENHANCED THERMOPHOTOVOLTAIC CONVERTER

RELATED APPLICATION

This application is a divisional of U.S. co-pending application Ser. No. 14/180,341 filed Feb. 13, 2014 entitled "Metamaterial Enhanced Thermophotovoltaic Converter".

FIELD OF THE INVENTION

This invention relates to apparatus and methods for generating electricity using thermophotovoltaic energy conversion.

BACKGROUND OF THE INVENTION

Thermophotovoltaic (TPV) energy conversion involves the conversion of heat to electricity, and has been identified as a promising technology since the 1960's. A basic TPV system includes a thermal emitter and a photovoltaic diode receiver. The thermal emitter is typically a piece of solid material or a specially engineered structure that generates thermal emission when heated to a high temperature (i.e., typically in a range from about 1200° K to about 1500° K). Thermal emission is the spontaneous radiation (emission) of photons due to thermal motion of charges in the thermal emitter material. For normal TPV system operating temperatures, the radiated photons are mostly at near infrared and infrared frequencies. The photovoltaic diode receiver includes a photovoltaic (PV) cell positioned to absorb some of these radiated photons, and is constructed to convert the absorbed photons into free charge carriers (i.e., electricity) in the manner typically associated with conventional solar cells. In effect, a solar energy system is a type of TPV energy conversion system where the sun acts as the thermal emitter. However, the present invention is directed to "earth-bound" TPV energy conversion systems in which the thermal emitter is solid structure that is heated from an external source (e.g., by concentrated sunlight or other heat generator).

Although TPV energy conversion is promising in theory, practical conventional TPV systems have achieved far lower efficiencies than theoretically predicted. A TPV system can be modeled as a heat engine in which the hot body (i.e., the heated thermal emitter) is described as a blackbody radiation source having a black body temperature $T_{BB}$, and the relatively cold PV receiver has a temperature $T_{PV}$, whereby the theoretical thermodynamic efficiency limit is given by the Carnot cycle $\eta_{Carnot}=(T_{BB}-T_{PV})/T_{BB}$. For a thermal emitter temperature $T_{BB}$ equal to 1500° K and a PV receiver temperature $T_{PV}$ equal to 300° K, a theoretical efficiency $\eta_{Carnot}$ equals 0.8 (80%), which exceeds the Shockley-Queisser limit (i.e., the maximum theoretical efficiency of a solar cell using a p-n junction to collect power). In reality, however, the efficiencies of conventional TPV systems are reported to be below 10%. This is believed to stem from a mismatch between the spectrum of the thermal emitter and the PV cell.

One reason for the lower realized efficiencies of conventional TPV systems is related to carrier thermalization at high temperatures caused by a mismatch between the emitted photons and the PV cells. Thermal radiation from the thermal emitter (hot body) of a TPV system has a spectral power density given by Planck's law, and the peak wavelength $\lambda_{max}$ is given by Wien's law ($\lambda_{max} \sim (2898/T_{BB})$ µm). For high-temperature emitters (1100° K≤$T_{BB}$≤1500° K), the peak wavelength $\lambda_{max}$ is in the range of 1.9 to 2.6 µm, which requires the TPV system to utilize PV cells having low bandgap semiconductors (i.e., around 0.5-0.8 eV). Using such low bandgap PV cells requires the use of emitter materials having bandgaps closer to 0.5 eV (~2.5 µm) in order to obtain a larger fraction of in-band photons at reasonable emitter temperatures (i.e., 1100-1500° K). If emitter materials having bandgaps below 0.5 eV are used, the PV cell performance suffers from high carrier thermalization at the elevated temperatures required in TPV systems.

What is needed is a thermophotovoltaic (TPV) converter that overcomes the problems set forth above and converts heat energy to electricity with a much higher efficiency than achieved using conventional TPV approaches. What is particularly needed is a TPV converter that achieves efficiencies of at least 25% with a wide variety of different PV cell types.

SUMMARY OF THE INVENTION

The present invention is directed to a TPV converter that utilizes a spectrally-selective metamaterial emitter and an associated PV cell to convert heat energy (e.g., concentrated sunlight or heat from combustion process) into electrical energy (electricity) with efficiencies that are much higher than those achieved using conventional TPV approaches. The spectrally-selective metamaterial emitter includes a novel bull's eye (circular target-shaped) structure that converts heat energy into a highly directional, narrow bandwidth radiant energy beam having a peak emission wavelength that is roughly equal to a fixed grating period separating concentric circular ridge structures that form the bull's eye structure. By fabricating a spectrally-selective metamaterial emitter including bull's eye structures having a fixed grating period that roughly equals (or overlaps) the EQE curve (optimal conversion spectrum) of the associated ("matched") PV cell, the TPV converter achieves an efficiency of 25% or higher at elevated operating temperatures of more than 1400° K. Moreover, because the peak emission wavelength of the radiant energy beam is easily changed by way of changing the fixed grating period, the spectrally-selective metamaterial emitter is effectively "tunable" (adjustable) to match the optimal conversion spectrums of different PV cell types.

According to a generalized embodiment of the present invention, the TPV converter utilizes a spectrally-selective metamaterial emitter having one or more bull's eye structures disposed on a planar surface of a plate-like (solid) base substrate, and an associated PV cell disposed in a fixed relationship to receive the radiant energy beam emitted from the bull's eye structure(s). Each bull's eye structure includes multiple concentric circular ridge structures that extend from the planar surface of the base substrate and are separated by intervening circular grooves, where each adjacent pair of ridge structures is separated by a fixed grating period. The associated PV cell includes one or more semiconducting materials that convert light to electricity by capturing (absorbing) "in-band" photons (i.e., photons having certain energies/wavelengths that are conducive to capture by the PV cell's particular semiconducting material composition) in way that generates electron-hole pairs, which are then separated for extraction. The "in-band" photons associated with the PV cell are photons that have energies/wavelengths within the PV cell's optimal conversion spectrum (i.e., as determined by the PV cell's External Quantum Efficiency (EQE) curve), which in part depends on the associated PV cell's composition). The associated PV cell's efficiency (i.e., the ratio of photons absorbed/converted over the total number of incident photons) is directly related to the percentage of incident photons that are "in-band" photons (i.e., photons having energies within its optimal conversion spectrum). That is, each PV cell converts "in-band" photons at a higher efficiency than "out-of-band" photons (i.e., photons having energies outside the optimal conversion spectrum). According to an aspect of the present invention, the bull's eye structure is configured to "match" the EQE curve of the associated PV cell by fabricating the bull's eye structure with a fixed grating period that is roughly equal to the wavelength of an "in-band" photon that is within the optimal absorption spectrum of the associated PV cell. Accordingly, when the metamaterial emitter is heated to a temperature above 1000° K, a radiant energy beam emitted from the bull's eye structure has a peak emission wavelength that is within the associated PV cell's optimal conversion spectrum, whereby the spectrally-selective metamaterial emitter is "matched" to the associated PV cell in the sense that a high percentage of the photons forming the radiant energy beam are absorbable/convertible by the associated PV cell. Further, when the metamaterial emitter is heated to a temperature above 1400° K, the overall efficiency of the TPV emitter is increased to 25% or higher.

In accordance with an embodiment of the present invention, a TPV converter utilizing a low-bandgap PV cell having "in-band" photons that are in the optimal conversion wavelength range of 0.5 microns to 3 microns. In order to generate/emit a high percentage of in-band photons for such low-bandgap PV cells, the metamaterial emitter is fabricated to include bull's eye structures having fixed grating periods in the range of 10 nanometers and 5 microns. In a presently preferred embodiment, a metamaterial emitter is produced with bull's eye structures having a grating period in the range of 0.5 to 3.0 microns (e.g., 1.5 microns) in order to match the specific absorption curve of a selected low-bandgap (e.g., GaSb) PV cell having a cell-specific optimal conversion wavelength range of 1.0 to 2.0 microns. By determining the optimal wavelength range of a PV cell and then fabricating a "matching" spectrally-selective metamaterial emitter (i.e., including bull's eye structures having one or more fixed grating periods that are within the determined associated optimal wavelength range), the present invention facilitates the production of high-efficiency TPV converters that utilize a wide range of PV cell types, thereby facilitating a strategic selection of the associated PV cell type (e.g., based on low-cost or high-performance) without sacrificing converter efficiency.

According to an aspect of the present invention, the entire metamaterial thermal emitter (i.e., both the base substrate and the "bull's eye" structure) are entirely formed using one or more metals. This all-metal construction is critical for withstanding high optimal operating temperatures (i.e., 1000 to 1500° K) without delamination (which can occur when one or more dielectric are used), and because metallic surfaces support surface plasmons (or spoof surface plasmons) that are required to facilitate the efficient emission of the highly directional, narrow band radiant energy and having the desired peak emission wavelength. In a specific embodiment, both the base substrate and the "bull's eye" structure are entirely formed using one or more refractory metals (e.g., Rhenium, Tantalum or Tungsten), or metal alloys, because these metals are able to withstand the higher operating temperatures (i.e., approaching 1500° K) without melting or deforming. In a presently preferred embodiment, both the base substrate and the "bull's eye" structure are entirely formed using Rhenium or a Rhenium alloy because the ability of this metal/alloy to withstand high temperatures is well known from their use in high-performance jet and rocket engines.

According to a specific embodiment of the present invention, the metamaterial thermal emitter of a TPV converter is configured to include multiple bull's eye structures disposed in an array of the base substrate in order to produce radiant energy beam with a broad spectral bandwidth, in order to increase the number of in-band photons that are efficiently converted by the associated PV cell into electricity. In a specific embodiment, the bull's eye structures are disposed in sets of two or more, with each bull's eye structure of each set having a corresponding fixed grating period between adjacent concentric circular ridges that is different from the fixed grating periods of the other bull's eye structures of that set. In an exemplary embodiment, the associated PV cell is a low-bandgap PV cell having a bandgap of approximately 1.72 microns, and each set includes three bull's eye structures respectively having concentric circular ridges that are formed with corresponding fixed grating periods that are equal to 1.3 microns, 1.5 microns and 1.7 microns, respectively. The different bull's eye structures of each set emit a mix of photons having the various wavelengths determined by the different grating periods, thereby producing a broadened emission spectrum that increases the number of in-band photons for conversion by the associated PV cell.

In another specific embodiment, a metamaterial emitter of a TPV converter is configured to include an array of bull's eye structures arranged in a multiplexed (overlapping) pattern (i.e., such that at least some of the concentric circular ridge structures of each bull's eye structure intersect at least some of the concentric circular ridge structures of an adjacent bull's eye structure, thereby concentrating the emitted radiant energy to increase spectral bandwidth. Further, by disposing the bull's eye structures in sets having different fixed grating periods, as described above, the metamaterial emitter both concentrates and combines adjacent narrowband spectra to produce a high energy emission with a broader overall spectrum that can be used, for example, to maximize the number of in-band photons converted by a target PV cell, thereby maximizing the PV cell's output power density.

According to an exemplary practical embodiment of the present invention, the metamaterial emitter of a TPV converter includes a box-like enclosure formed by a peripheral wall, with one or more bull's eye structures disposed as described above on at least two outward facing surfaces of the peripheral wall (i.e., such that at least two radiant energy beams are emitted in at least two (e.g., upward and downward) directions from the metamaterial emitter), and the TPV converter further includes at least two PV cells positioned to receive the at least two radiant energy beams. The peripheral wall of the emitter's box-like enclosure surrounds a substantially rectangular interior cavity and includes an inlet opening through which heat energy (e.g., concentrated sunlight) is supplied into the cavity during operation, and an outlet opening through which waste heat is allowed to exit the cavity. Each bull's eye structure is configured to generate a radiant energy beam that is matched to the associated PV cell positioned to receive the radiant energy beam. In one embodiment, the box-like enclosure is an all-metal structure to facilitate the required high operating temperatures (i.e., 1000 to 1500° K) without delamination (which can occur with metal/dielectric structures). In a specific embodiment, the all-metal box-like enclosure is formed entirely from refractory metals (e.g., Rhenium, Tantalum or Tungsten) to further enhance the enclosure's operational lifetime. In another specific embodiment, at least one bull's eye structure is disposed on the outward-facing surfaces of two opposing (e.g., upper and lower) peripheral wall portions, thereby generating two radiant energy beams that are directed in different directions from the metamaterial emitter. This arrangement provides optimal energy beam generation because the flat/planar wall surfaces facilitate cost-effective fabrication of the bull's eye structures (i.e., using existing photolithographic fabrication techniques), and the rectangular-shaped interior cavity defined between the two opposing flat peripheral wall portions facilitates efficient transfer of heat energy (e.g., by allowing concentrated sunlight to reflect between the opposing interior surfaces as it propagates along the interior cavity).

In yet another specific embodiment optimized for converting concentrated solar energy into infrared emissions, the all-metal box-like enclosure is configured to channel solar energy into the interior cavity defined between the two opposing peripheral wall portions in a manner that maximizes the transfer of heat energy to the peripheral wall portions, which in turn maximizes the amount of radiant energy emitted in first and second radiant energy beam respectively emitted from the bull's eye structures formed on the respective outward-facing surfaces to two associated PV cells fixedly positioned to receive the first and second radiant energy beams, respectively. First, a compound parabolic trough is formed by corresponding metal structures that are respectively integrally connected to corresponding front end portions of the opposing peripheral wall portions, wherein the compound parabolic trough is operably shaped to channel concentrated sunlight through the inlet opening into the interior cavity such that it reflects between the inside surfaces of the two opposing peripheral wall portions. In addition, a funnel-shaped outlet is formed by corresponding metal structures respectively integrally connected to the rear end portions of the peripheral wall portions that releases waste heat from interior cavity through the outlet opening in a manner that enhances energy transfer to the bull's eye structures. To maximize the amount of emitted radiant energy, multiple multiplexed bull's eye structures are formed in arrays as described above on the outward-facing surfaces of the peripheral wall portions. To minimize thermal cycling stresses and to maximize the operating lifetime of the metamaterial emitter, the entire all-metal box-like enclosure (i.e., including the peripheral wall portions, the compound parabolic trough structures, and the funnel-shaped outlet structures) are constructed using a refractory metal (e.g., Rhenium, Tantalum or Tungsten) or a refractory metal alloy (e.g., Rhenium alloy).

In yet another embodiment of the present invention, a TPV converter is produced by determining an optimal conversion spectrum (wavelength range) associated with in-band photons converted by a PV cell into electricity, and then fabricating a spectrally-selective metamaterial emitter by generating a patterned mask on a planar surface of a refractory metal substrate by way of photolithography such that the patterned mask includes concentric circular resist structures having a fixed grating period that is roughly equal to the predetermined optimal wavelength, then utilizing the mask to form concentric circular refractory metal ridge structures on the planar surface having the fixed grating period. In alternative embodiments, the concentric circular ridge structures are formed either using an additive process (e.g., where refractory metal, which can be the same or different from the base substrate, is deposited by way of sputtering or other technique into slots formed in the mask) or a subtractive process (e.g., where the base substrate is dry etched through the mask slots, whereby the concentric ridge structures comprise the same refractory metal as the base substrate). To generate multiplexed bull's eye structures, the mask is formed with concentric circular resist structures disposed in the desired multiplexed arrangement. After forming the concentric circular ridge structures, the mask is removed to expose the intervening concentric circular grooves separating the ridges, thereby completing fabrication of one or more bull's eye structures that generates radiant energy whose peak emission wavelength is "matched" to the optimal conversion spectrum of the PV cell. Once fabrication of the spectrally-selective metamaterial emitter is completed, the PV cell is fixedly mounted over the one or more bull's eye structures, thereby completing production of the TPV converter.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in TPV (heat-to-electricity) converters. The following description is presented to enable one of ordinary skill in the art to make and use the invention as provided in the context of a particular application and its requirements. As used herein, directional terms such as "upper", "upward", "lower", "downward", "over", "under", "front" and "rear", are intended to provide relative positions for purposes of description, and are not intended to designate an absolute frame of reference. In addition, the phrases "integrally formed" and "integrally connected" are used herein to describe the connective relationship between two portions of a single fabricated or machined structure, and are distinguished from the terms "connected" or "coupled" (without the modifier "integrally"), which indicates two separate structures that are joined by way of, for example, adhesive, fastener, clip, or movable joint. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
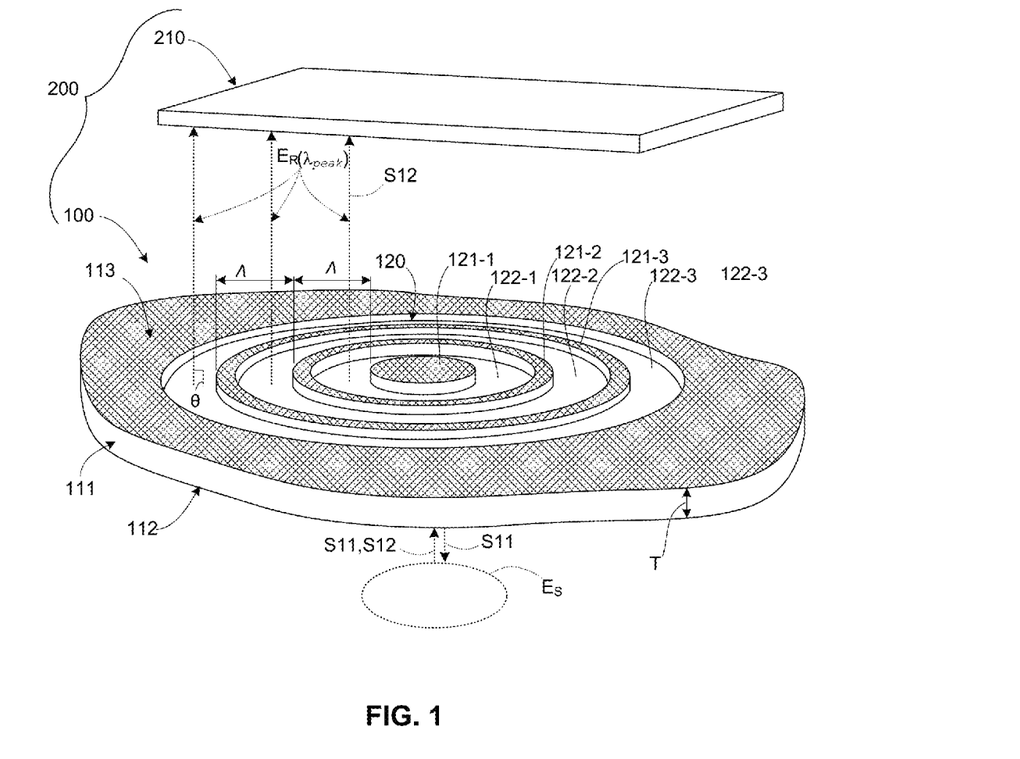
FIG. 1 is a perspective view showing a partial TPV converter according to an embodiment of the present invention.

FIG. 1 is a perspective top view showing a generalized TPV converter 200 comprising a simplified spectrally-selective metamaterial emitter 100 that converts heat energy $E_S$ into a highly directional radiant energy beam $E_R$, and an associated PV cell 210 that is fixedly disposed to receive photons transmitted in radiant energy beam $E_R$.

Spectrally-selective metamaterial emitter 100 generally includes a base substrate 111 and a novel bull's eye (circular target-shaped) structure 120 that is integrally formed on base substrate 111.

Base substrate 111 is a solid (wall-like) plate having a planar lower (first) surface 112 and an opposing planar upper (second) surface 113 on which bull's eye structure 120 is integrally formed. During operation, lower surface 112 faces a source of heat energy $E_S$, and upper surface 113 faces away from the heat energy source. Base substrate 111 is preferably entirely constructed from metal, and more preferably is entirely constructed using one or more refractory metals (e.g., Rhenium, Tantalum, or Tungsten), or a refractory metal alloy (e.g., Rhenium alloy). In an exemplary practical exemplary embodiment (e.g., when used as part of TPV system 200), base substrate 111 has a thickness T on the order of more than a wavelength of emitted radiant energy $E_R$ (described below), but may have any arbitrary thickness outside of this constraint.

Bull's eye structure 120 includes concentric circular ridge structures 121-1, 121-2 and 121-3 that are integrally formed on upper surface 113 of base substrate 111 (i.e., either formed from the same material as base substrate 111 by a subtractive process such as etching or milling, or formed by an additive process such as sputtering that effectively melds (fuses) the added material to the base substrate material). Ridge structures 121-1, 121-2 and 121-3 are respectively separated by intervening circular grooves 122-1, 122-2 and 122-3 that extend into (but not through) base substrate 111 such that each adjacent pair of ridge structures is separated by a fixed grating period (pitch distance) Λ. For example, ridge structures 121-1 and 121-2 are separated by circular groove 122-1 such that the distance between an outside edge of ridge structure 121-1 and outside edge of ridge structure 121-2 is equal to the grating period Λ. Similarly, ridge structures 121-2 and 121-3 are separated by circular groove 122-2 such that the distance between an outside edge of ridge structure 121-2 and outside edge of ridge structure 121-3 is equal to the same grating period Λ as that separating ridge structures 121-1 and 121-2. Ridge structures 121-1 to 121-3 comprise metal that may be different from the material that forms base substrate 111, but preferably both the ridge structures and the base substrate comprise the same metal material to avoid thermal mismatch issues.

According to an aspect of the present invention, bull's eye structure 120 is configured such that, when heat energy $E_S$ is applied to lower surface 112 and is sufficient to heat base substrate 111 to a temperature above 1000° K, radiant energy $E_R$ is emitted from upper surface 113 having a peak emission wavelength $\lambda_{peak}$ that is roughly equal to (i.e., within 25% of) fixed grating period Λ. A relationship between the specific geometric dimensions associated with bull's eye structure 120 and the characteristics of emitted radiant energy beam $E_R$ are explained in additional detail in co-owned and co-pending U.S. patent application Ser. No. 14/180,333, entitled "SPECTRALLY-SELECTIVE METAMATERIAL EMITTER", which is incorporated herein by reference in its entirety.

According to another aspect of the present invention, emitted radiant energy beam $E_R$ is highly directional (i.e., 90% of the emitted radiant energy is within 0.5° of perpendicular (angle θ) to the planar outward-facing surface 113), narrow band (i.e., the full-width at half maximum of the emitted radiant energy is within 10% of peak emission wavelength $\lambda_{peak}$) and peak emission wavelength $\lambda_{peak}$ that is roughly equal to the fixed grating period λ separating each adjacent pair of concentric circular ridge structures (i.e., the peak emission wavelength is within 25% of the grating period Λ). Accordingly, metamaterial emitter 100 is selectively "tunable" (adjustable) by way of adjusting the fixed grating period Λ0 separating the concentric circular ridge structures 121-1 to 121-3. For example, if a first metamaterial emitter is found to generate radiant energy whose peak wavelength is non-optimal (e.g., too low) for a particular PV cell, then a second metamaterial emitter with an appropriately adjusted (e.g., larger) fixed grating period can be fabricated that generates a higher peak wavelength, thereby effectively "tuning" the radiant energy to the optimal peak wavelength.

Although emitter 100 can include grating periods of almost any size, in the exemplary practical embodiment depicted in FIG. 1 (e.g., when used as part of TPV system 200 including a low-bandgap PV cell 210), ridge structures typically has a grating period Λ in the range of 0.5 microns and 5.0 microns, which corresponds with the absorption curves of most commercially available PV cells. In a particularly preferred embodiment (e.g., when PV cell 210 is a GaSb PV cell having an optimal wavelength range of said PV cell is 1.0 microns to 2.0 microns), emitter 100 is produced with a grating period Λ in the range of 0.5 microns and 3.0 microns.

According to another aspect of the present invention, metamaterial emitter 100 effectively functions as a narrow-band filter element (spectral control element) that only passes in-band photons to an associated target (e.g., photons having wavelengths within the EQE curve of a target PV cell), and is capable of preventing out-of-band photons from reaching the target. This filtering function is illustrated in FIG. 1, where the broadband characteristics of the photons associated with heat energy $E_S$ are identified using S-parameter S11 to indicate out-of-band photons, and S-parameter S12 to indicate in-band photons. Because bull's eye structure 120 is "tuned" to the EQE curve of PV cell 210, metamaterial emitter 100 effectively "passes" in-band photons S12 to PV cell 120. Conversely, the all-metal structure of metamaterial emitter 100 forms a type of barrier between heat energy $E_S$ and PV cell 210 that effectively "blocks" (i.e., prevents out-of-band photons S12 from reaching the PV cell. Note that this filtering functionality would not be possible if base substrate 111 were not a solid sheet (i.e., if the substrate included holes that allowed both S11 and S12 to pass through). By passing only in-band photons to associated PV cell 210, the present invention greatly increases the efficiency of TPV converter 200 over conventional approaches.

Figure 2:
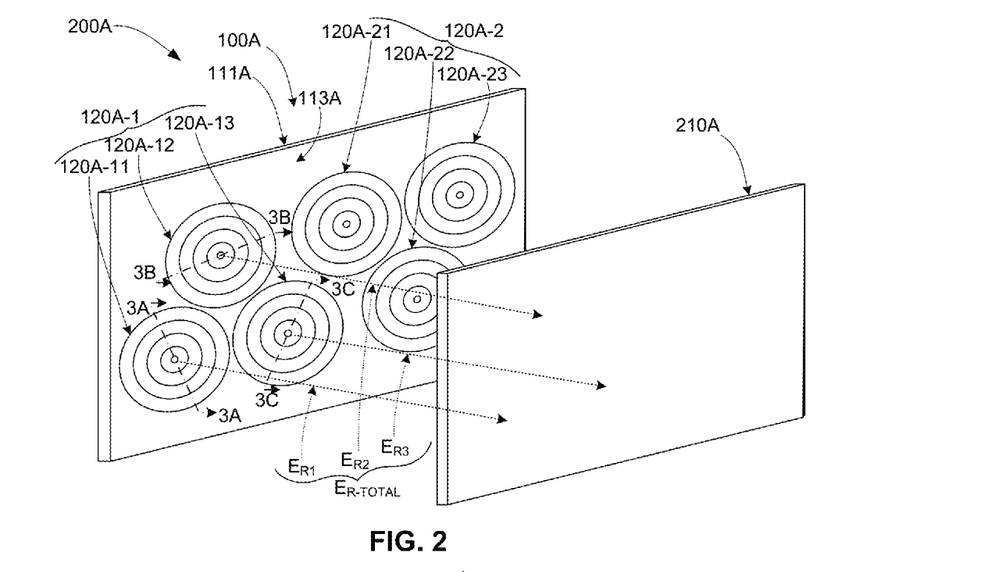
FIG. 2 is a perspective view showing a TPV converter according to a second embodiment of the present invention.
Figure 3A:
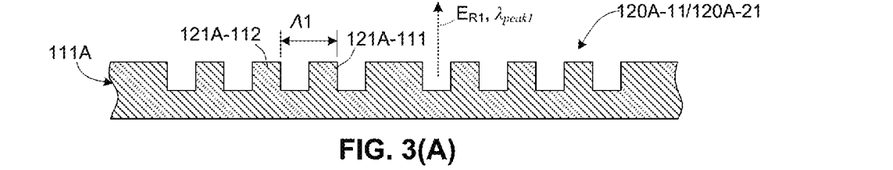
FIGS. 3(A), 3(B) and 3(C) are cross-sectional side views taken along section lines 3A-3A, 3B-3B and 3C-3C, respectively, of FIG. 2 showing bull's eye structures with different fixed grating periods.
Figure 3B:
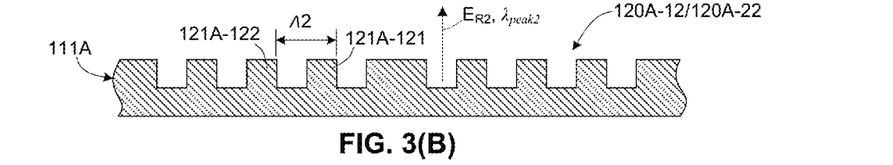
Figure 3C:
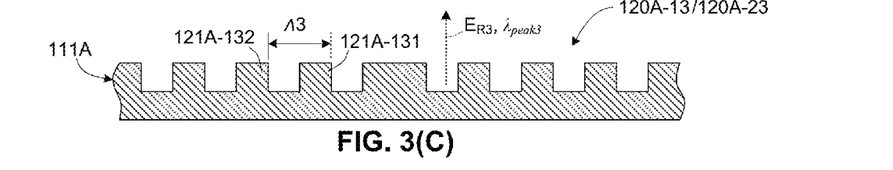

FIG. 2 is a simplified perspective view showing a TPV converter 200A including a metamaterial emitter 100A having multiple bull's eye structures 120A-11 to 120A-13 and 120A-21 to 120A-23 that are formed on a "target-facing" surface 113A of a base substrate 111A in a manner similar to that described above. FIGS. 3(A) to 3(C) are cross-sectional views taken along section lines 3A-3A, 3B-3B, and 3C-3C of FIG. 2.

Metamaterial emitter 100A is characterized in that it utilizes multiple bull's eye structures arranged in sets of three, where each bull's eye structure of each set has a different fixed grating period to effectively broaden a total radiant energy beam $E_{R\text{-}TOTAL}$ emitted by the metamaterial emitter 100A. Referring to FIG. 2, the multiple bull's eye structures are arranged in two sets 120A-1 and 120A-2, where each set includes three bull's eye structures (i.e., set 120A-1 includes bull's eye structures 120A-11 to 120A-13, and set 120A-2 includes bull's eye structures 120A-21 to 120A-23). Each set 120A-1 and 120A-2 includes one bull's eye structure having grating period Λ1, one bull's eye structure having grating period Λ2, and one bull's eye structure having grating period Λ3. Specifically, as indicated in FIG. 3(A), set 120A-1 includes structure 120A-11 having concentric circular ridge structures spaced at a fixed grating period Λ1 (e.g., the distance between adjacent structures 121A-111 and 121A-112 is equal to grating period Λ1). FIG. 3(A) also represents bull's eye structure 210A-22 of set 120A-2, which includes ridge structures having fixed grating period Λ1 formed in the same manner depicted by adjacent structures 121A-111 and 121A-112. Similarly, FIG. 3(B) shows that both structure 120A-12 of set 120A-1 and structure 210A-22 of set 120A-2 have grating period Λ2 (e.g., as depicted by adjacent structures 121A-121 and 121A-122, which are separated by grating period Λ2), and FIG. 3(C) shows that both structure 120A-13 of set 120A-1 and structure 210A-23 of set 120A-2 have grating period Λ3 (e.g., as depicted by adjacent structures 121A-131 and 121A-132, which are separated by grating period Λ3).

The benefit of forming metamaterial emitter 100A with three different grating periods is that this approach can be used to selectively broaden the overall spectrum of the total radiant energy beam $E_{R\text{-}TOTAL}$ emitted by metamaterial emitter 100A to associated PV cell 210A. That is, because the radiant energy generated by a particular bull's eye structure is related to its fixed grating period, a broadened the total radiant energy beam $E_{R\text{-}TOTAL}$ is generated by emitter 100A (shown in FIG. 2) by utilizing three different grating periods Λ1, Λ2 and Λ3. For example, assume fixed grating period Λ3 is larger than fixed grating period Λ2, and fixed grating period Λ2 is larger than fixed grating period Λ1. As indicated in FIGS. 3(A) to 3(C), these different grating periods generate component radiant energy beams to having different peak emission wavelengths. That is, because fixed grating period Λ3 is greater than fixed grating period Λ2, component radiant energy beams $E_{R3}$ emitted from bull's eye structures 120-13 and 120-23 have a peak emission wavelength $\lambda_{peak3}$ that is greater than a peak emission wavelength $\lambda_{peak2}$ of radiant energy $E_{R2}$ generated by bull's eye structures 120-12 and 120-22. Similarly, the peak emission wavelength $\lambda_{peak2}$ of radiant energy beam $E_{R2}$ is greater than a peak emission wavelength $\lambda_{peak1}$ of radiant energy $E_{R1}$ generated by bull's eye structures 120-11 and 120-21). Referring again to FIG. 2, the total radiant energy beam $E_{R\text{-}TOTAL}$ is a combination of component radiant energy beams $E_{R1}$, $E_{R2}$ and $E_{R3}$, and the effect of combining the adjacent narrowband spectra of component beams $E_{R1}$, $E_{R2}$ and $E_{R3}$ is to broaden the overall spectrum of total radiant energy beam $E_{R\text{-}TOTAL}$. This approach can be used, for example, to provide more in-band photons to associated PV cell 210A, and consequently to increase the output power density of TPV converter 200A.

The approach set forth above with reference to FIGS. 2 and 3(A) to 3(C) is extendible to any number of fixed grating periods in order to selectively broaden the overall spectrum of a total radiant energy beam. That is, although the approach is described with reference to six bull's eye structures disposed in two sets of three that utilize three different grating periods, it is understood that the approach is extendable to any number of bull's eye structures disposed in any number of sets of two or more bull's eye structures. For example, a metamaterial emitter may include only two grating periods to facilitate the emission of a relatively narrow emission spectrum, or a spectrum having two separated "peak" emission wavelengths. Alternatively, the use of a large number of grating periods facilitates the emission of a relatively broad emission spectrum. It is also possible to fabricate a metamaterial emitter that in which all bull's eye structures have a unique fixed grating period (i.e., no two bull's eye structures have the same grating period). Unless otherwise specified, the appended claims are intended to cover all of the above-mentioned combinations of different grating periods.

Figure 4:
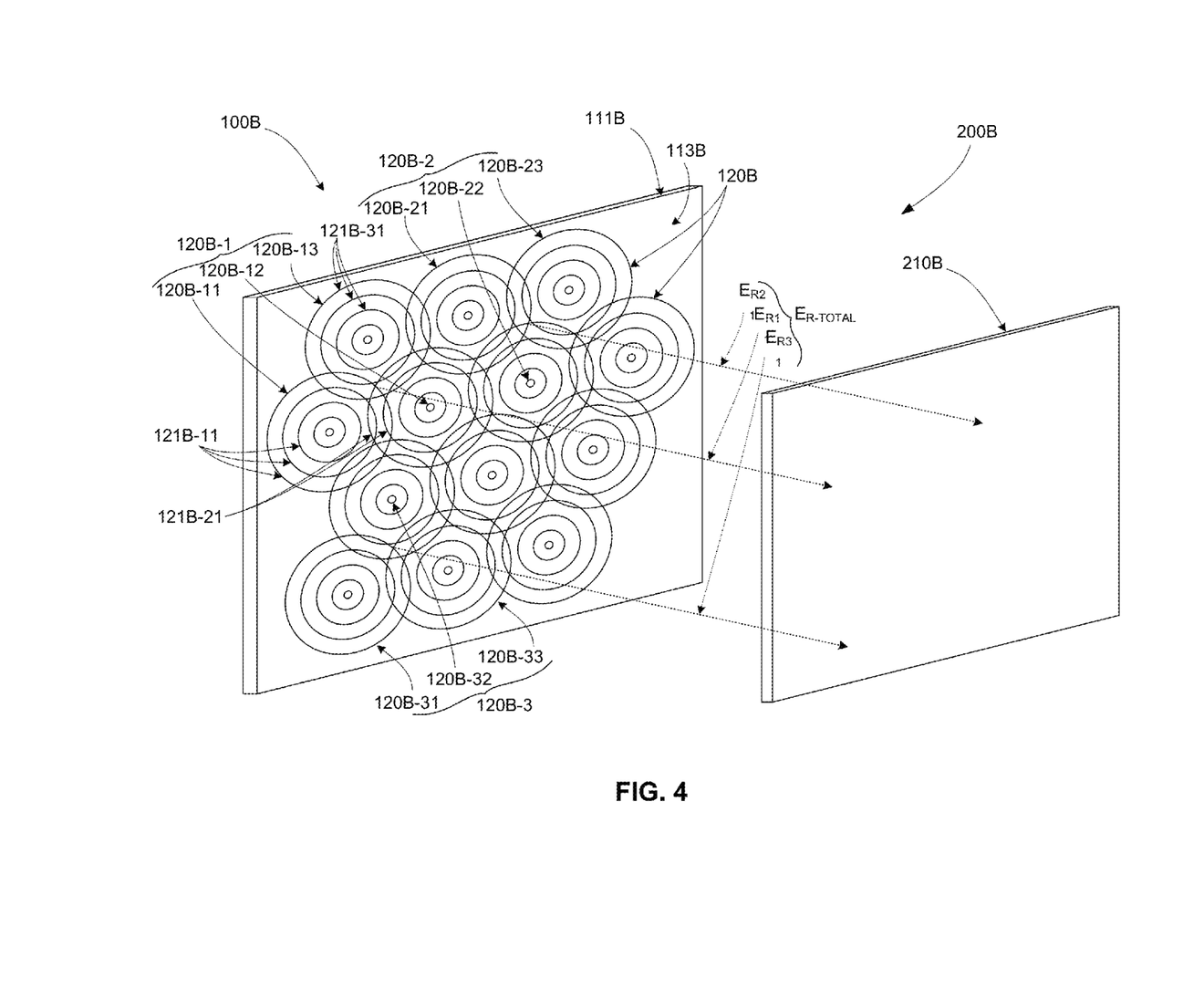
FIG. 4 is a perspective view showing a TPV converter according to a third embodiment of the present invention.

FIG. 4 is a perspective view showing a TPV converter 200B having a metamaterial emitter 100B and a PV cell 210B, where metamaterial emitter 100B includes multiple bull's eye structures formed on a "target-facing" surface 113B of a base substrate 111B in a manner similar to that described above. Metamaterial emitter 100B differs from the previous embodiments in that the multiple bull's eye structures are formed in a "multiplexed" (overlapping) pattern (i.e., such that at least some of the circular ridge structures of one bull's eye structure intersect at least some of the circular ridge structures of at least one adjacent bull's eye structure). For example, referring to the upper left corner of FIG. 4, bull's eye structure 120B-11 includes a first group of concentric circular ridge structures 121B-11, and adjacent bull's eye structure 120B-12 includes a second group of concentric circular ridge structures 121-12. Bull's eye structures 120B-11 and 120B-12 form a multiplexed pattern in that at least some of circular ridge structures 121B-11 of bull's eye structure 120B-11 intersect (overlap) at least some of circular ridge structures 121B-12 of bull's eye structure 120B-12. This multiplex pattern serves to concentrate radiant energy $E_{R\text{-}TOTAL}$ emitted by metamaterial emitter 100B, which can be used, for example, to provide more in-band photons to PV cell 210B, and consequently to increase the output power density of TPV converter 200B.

According to a presently preferred embodiment, in addition to the multiplexed pattern, metamaterial emitter 100B is also fabricated to employ the multiple-grating-period approach described above with reference to FIG. 2 (i.e., such that at least one bull's eye structure has a fixed grating period that is different (e.g., larger) than the fixed grating period of another bull's eye structure). By way of example, the various multiplexed bull's eye structures of metamaterial emitter 100B are shown as being arranged in three sets: a first set 120B-1 including bull's eye structures 120B-11, 120B-12 and 120B-13, a second set 120B-2 including bull's eye structures 120B-21, 120B-22 and 120B-23, and a third set 120B-3 including bull's eye structures 120B-31, 120B-32 and 120B-33. Each set includes one bull's eye structure having a common first grating period (i.e., bull's eye structures 120B-11, 120B-21 and 120B-31 are fabricated using the same grating period in the manner described above with reference to FIG. 3(A)), one bull's eye structure having a second grating period (i.e., bull's eye structures 120B-12, 120B-22 and 120B-32 are fabricated in the manner described above with reference to FIG. 3(B)), and one bull's eye structure having a third grating period (i.e., bull's eye structures 120B-13, 120B-23 and 120B-33 are fabricated in the manner described above with reference to FIG. 3(B)). With this arrangement, metamaterial emitter 100B generates total radiant energy $E_{R\text{-}TOTAL}$ that both concentrates and combines adjacent narrowband spectra to produce a high energy emission with a broader overall spectrum that maximizes the number of in-band photons supplied to PV cell 210B, thereby maximizing the output power density of PV cell 210B.

Figure 5:
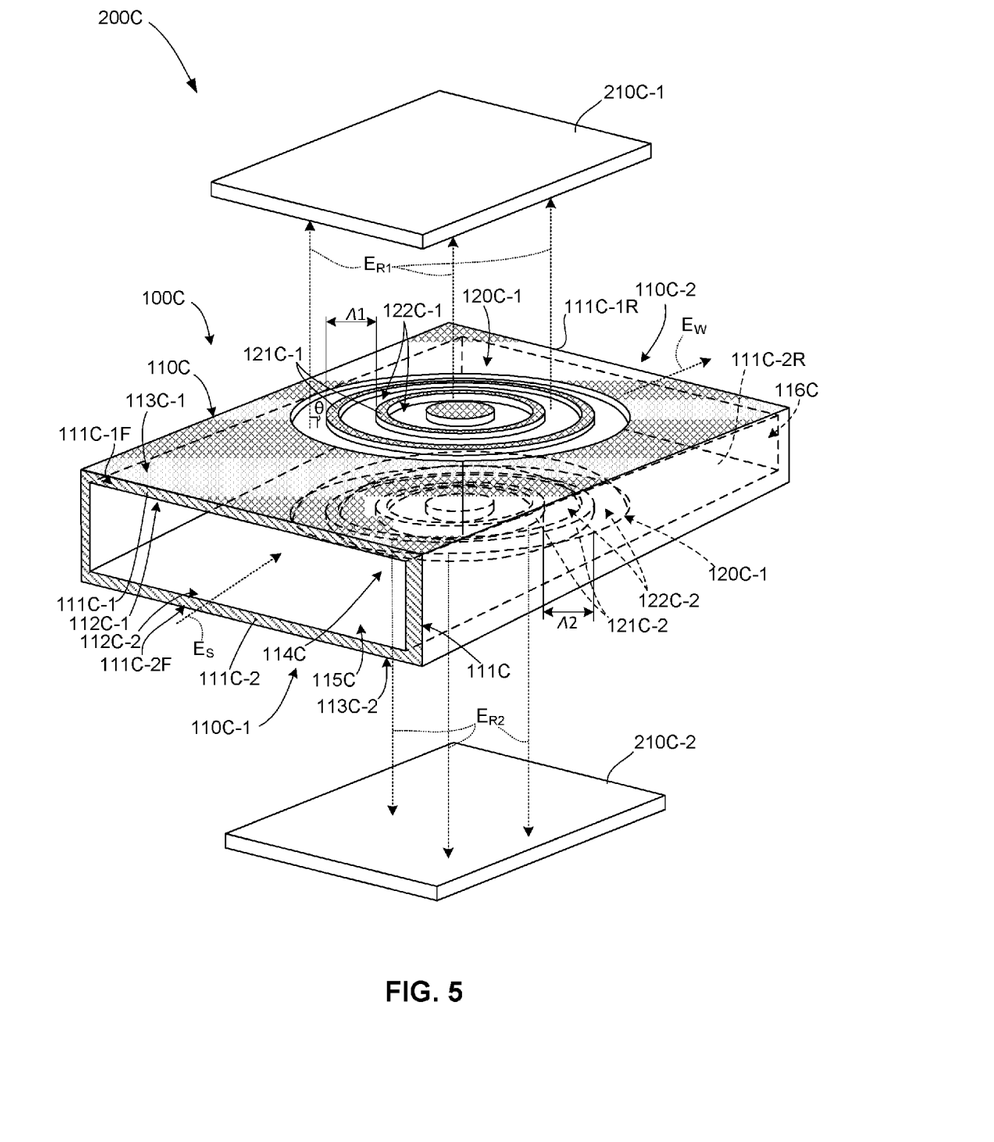
FIG. 5 is a perspective view showing a TPV converter according to a fourth embodiment of the present invention.

FIG. 5 is a perspective view showing a TPV converter 200C including a metamaterial emitter 100C and two PV cells 210C-1 and 210C-2. In this embodiment, the "base substrate" of TPV converter 200C is formed as part of a box-like enclosure 110C that facilitates achieving optimal high operating temperatures (i.e., 1000° K to 1500° K). Box-like enclosure 110C includes a peripheral wall 111C having an upper (first) peripheral wall portion 111C-1 and a lower (second) peripheral wall portion 111C-2 that are connected by respective side wall portions in an opposing spaced-apart (e.g., parallel) relationship such that a substantially rectangular interior cavity 114C is defined between wall portions 111C-1 and 111C-2. Peripheral wall portions 111C-1 and 111C-2 respectively include inward-facing surface portions 112C-1 and 112C-2 that face an interior cavity 114C, and outward-facing surfaces 113C-1 and 113C-2 that face away from interior cavity 114C (i.e., upward and downward, respectively, from box-like enclosure 110C). Peripheral wall portions 111C-1 and 111C-2 extend between an inlet end 110C-1 and an outlet end 110C-2 of box-like enclosure 110C such that an inlet opening 115C is defined between respective front end portions 111C-1F and 111C-2F of peripheral wall portions 111C-1 and 111C-2, and an outlet opening 116C is defined between respective rear end portions 111C-1R and 111C-2R of peripheral wall portions 111C-1 and 111C-2. During operation, "source" heat energy $E_S$ is supplied into the interior cavity 114C through inlet opening 115C, and "waste" heat energy is evacuated through outlet opening 116C.

Metamaterial emitter 100C includes two bull's eye structures 120C-1 and 120C-2 formed in the manner described above that are disposed on outward facing surfaces 113C-1 and 113C-2, respectively. Specifically, bull's eye structure 120C-1 is disposed on upward-facing surface 113C-1 of upper peripheral wall portion 111C-1 and includes concentric circular ridge structures 121C-1 separated by intervening circular grooves 122C-1 and separated by a fixed grating period $\Lambda1$, and bull's eye structure 120C-2 is disposed on downward-facing surface 113C-2 of lower peripheral wall portion 111C-2 and includes concentric circular ridge structures 121C-2 separated by intervening circular grooves 122C-2 and separated by a fixed grating period $\Lambda2$. In one specific embodiment, PV cells 210C-1 and 210C-2 are essentially identical (i.e., having the same spectral response), so fixed grating period $\Lambda2$ is the same as fixed grating period $\Lambda1$. In an alternative embodiment, PV cells 210C-1 and 210C-2 have different spectral responses, so fixed grating period $\Lambda2$ is different from (e.g., larger or smaller than) fixed grating period $\Lambda1$. With this arrangement, when heat energy $E_S$ is supplied into the interior cavity 114C and is sufficient to heat peripheral wall 111C to a temperature above 1000° K, radiant energy $E_{R2}$ is emitted upward from box-like enclosure 110C having a peak emission wavelength that is roughly equal to the fixed grating period $\Lambda1$ for conversion to electricity by PV cell 210C-1. At the same time, heat energy $E_S$ causes bull's eye structure 120C-2 to emit radiant energy $E_{R2}$ downward from box-like enclosure 110C to PV cell 210C-2, where radiant energy $E_{R2}$ has a peak emission wavelength that is roughly equal to the fixed grating period $\Lambda2$.

The box-like enclosure arrangement of metamaterial emitter 100C provides optimal energy beam generation because flat/planar peripheral wall portions 111C-1 and 111C-2 facilitate cost-effective fabrication of the bull's eye structures thereon (e.g., using existing photolithographic fabrication techniques), and because rectangular-shaped interior cavity 114C facilitates the efficient transfer of heat energy over the "base substrate" formed by peripheral wall portions 111C-1 and 111C-2. In one embodiment, the rectangular box-like arrangement facilitates the transfer of heat energy in the form of concentrated sunlight that reflects between the opposing upper and lower interior surfaces 112C-1 and 112C-2, thereby heating peripheral wall portions 111C-1 and 111C-2, and allowing associated waste heat to be removed from interior cavity 114C through outlet opening 116C. Moreover, because electricity is being generated by two PV cells 210C-1 and 210C-2 instead of just one (as in the generalized embodiments set forth above), this arrangement allows TPV converter 200C to provide increased electricity generation over a single PV cell approach. In yet another embodiment (not shown), the gist of this approach is further expanded to employ additional bull's eye structures and additional PV cells (e.g., disposed along the sides of box-like enclosure 110C, or along multiple surfaces of a non-rectangular box-shaped enclosure) to potentially further increase electricity generation.

According to an aspect of the invention, box-like enclosure 110C is constructed as an all-metal structure (e.g., constructed from a single metal block or by welding or otherwise securing four metal plates together). The all-metal structure facilitates achieving the required high operating temperatures (i.e., 1000 to 1500° K) over a suitable operating lifetime of metamaterial emitter 100C. In a specific embodiment, the all-metal box-like enclosure 110C is formed entirely using one or more refractory metals (e.g., Rhenium, Tantalum or Tungsten) or refractory metal alloys to further enhance the enclosure's operational lifetime.

Figure 6A:
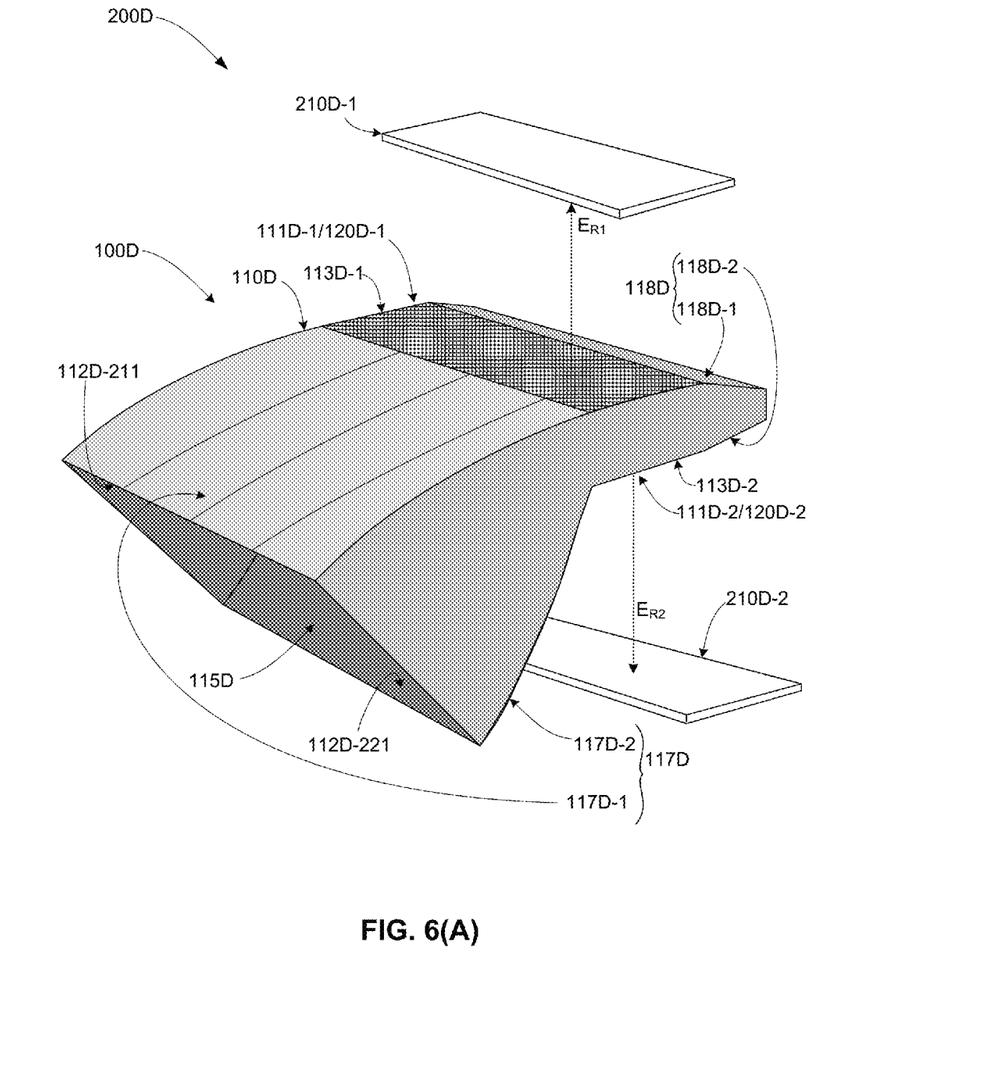
FIGS. 6(A) and 6(B) are perspective and cross-sectional side views showing a TPV converter according to a fifth embodiment of the present invention.
Figure 6B:
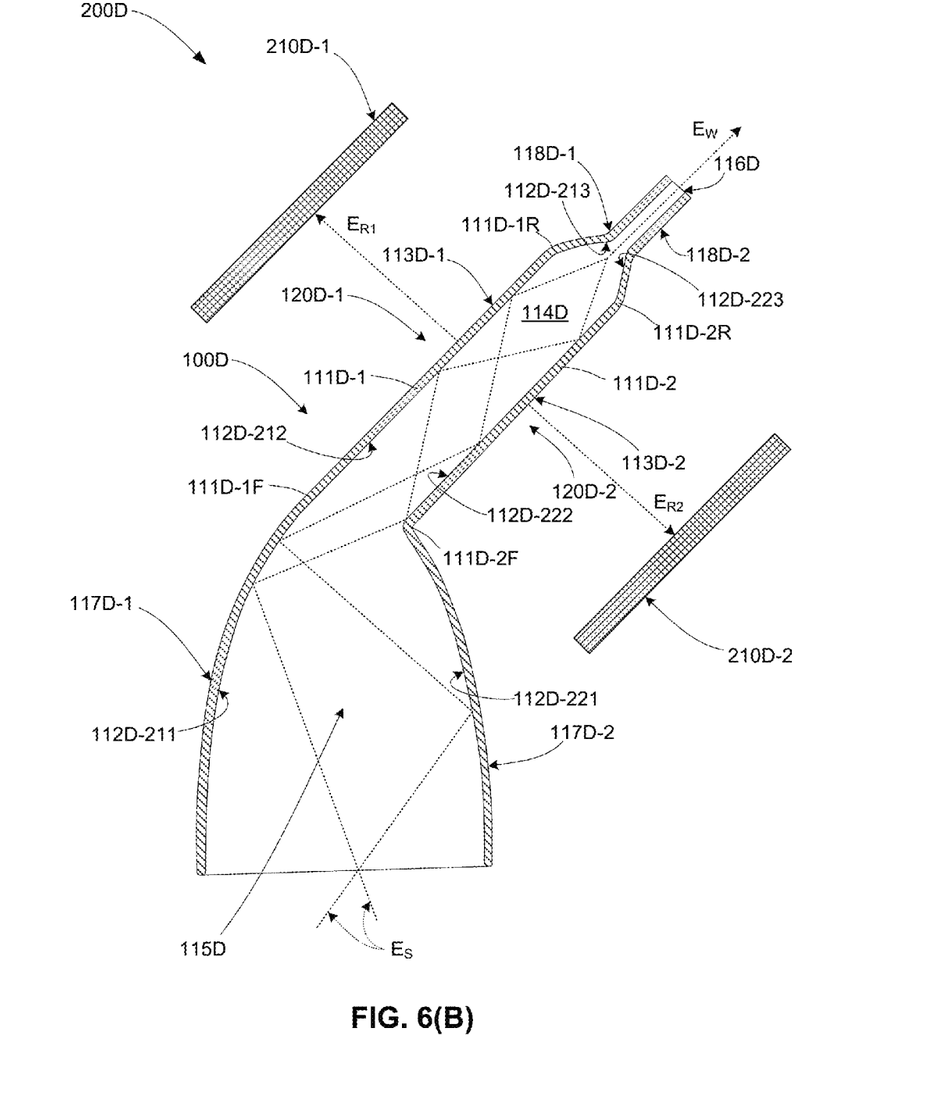

FIGS. 6(A) and 6(B) are perspective and cross-sectional side views showing a TPV converter 200D including a metamaterial emitter 100D and two PV cells 210D-1 and 210D-2 arranged in accordance with another embodiment. In this embodiment, metamaterial emitter 100D includes an all-metal box-like enclosure 110D that is configured for use in a solar tower power harvesting system such as that described in co-owned and co-pending U.S. patent application Ser. No. 14/180,346, entitled "Solar Tower Power Harvesting System With Metamaterial Enhanced Solar Thermophotovoltaic Converter (MESTC)", which is incorporated herein by reference in its entirety.

Metamaterial emitter 100D is similar to that described above with reference to FIG. 5 in that box-like enclosure 110D includes opposing upper (first) and lower (second) peripheral wall portions 111D-1 and 111D-2 that are connected by respective side wall portions in an opposing spaced-apart (e.g., parallel) relationship, and such that arrays 120D-1 and 120D-2 of bull's eye structures are respectively formed on outward-facing surfaces 113D-1 and 113D-2 of wall portions 111D-1 and 111D-2. Bull's eye structure arrays 120D-1 and 120D-2 are implemented using any of the various arrangements described above, but preferably include a multiplexed arrangement such as that shown in FIG. 4 to maximize the amount of energy transmitted in emitted radiant energy beams $E_{R1}$ and $E_{R2}$.

Metamaterial emitter 100D differs from previous embodiments in that it includes a compound parabolic trough 117D disposed at the inlet end of box-like enclosure 110D. As indicated in FIG. 6(B), the compound parabolic trough includes an upper (first) compound parabolic trough structure 117D-1 integrally connected to a front end portion 111D-1F of upper peripheral wall portion 111D-1, and a lower (second) compound parabolic trough structure 117D-2 integrally connected to a front end portion 111D-2F of lower peripheral wall portion 111D-2. As indicated by the dashed-line arrows in FIG. 6(B), compound parabolic trough structures 117D-1 and 117D-2 are operably shaped to channel concentrated sunlight $E_S$ through the inlet opening 115D into interior cavity 114D between peripheral wall portions 111D-1 and 111D-2 such that the sunlight reflects between the inside surfaces 112D-212 and 112D-222 of peripheral wall portions 111D-1 and 111D-2 in a manner that maximizes the transfer of heat energy to bull's eye structure arrays 120D-1 and 120D-2, which in turn maximizes the amount of radiant energy emitted in beams $E_{R1}$ and $E_{R2}$ respectively emitted from bull's eye structure arrays 120D-1 and 120D-2 to PV cells 210D-1 and 210D-2, respectively.

Metamaterial emitter 100D also differs from previous embodiments in that it includes a funnel-shaped outlet 117D disposed at the outlet end of box-like enclosure 110D that serves to control the release of "waste" heat from interior cavity 114D. As indicated in FIG. 6(B), the funnel-shaped outlet includes an upper (first) funnel-shaped outlet structure 118D-1 integrally connected to a rear end portion 111D-1R of upper peripheral wall portion 111D-1, and a lower (second) funnel-shaped outlet structure 118D-2 integrally connected to a rear end portion 111D-2R of lower peripheral wall portion 111D-2. As indicated by the dashed-line arrows in FIG. 6(B), funnel-shaped outlet structures 118D-1 and 118D-2 are operably shaped to channel "waste" heat energy $E_W$ from interior cavity 114D through outlet opening 116D at a rate that optimizes energy transfer to bull's eye structure arrays 120D-1 and 120D-2.

For reasons similar to those set forth above (e.g., to minimize thermal cycling stresses and to maximize the operating lifetime) the entirety of all-metal box-like enclosure 110D (i.e., including peripheral wall portions 111D-1 and 111D-2, compound parabolic trough structures 117D-1 and 117D-2, and funnel-shaped outlet structures 118D-1 and 118D-2) is constructed using metal, and more preferably using a single refractory metal (e.g., Rhenium, a Rhenium alloy, Tantalum or Tungsten).

Figure 7:
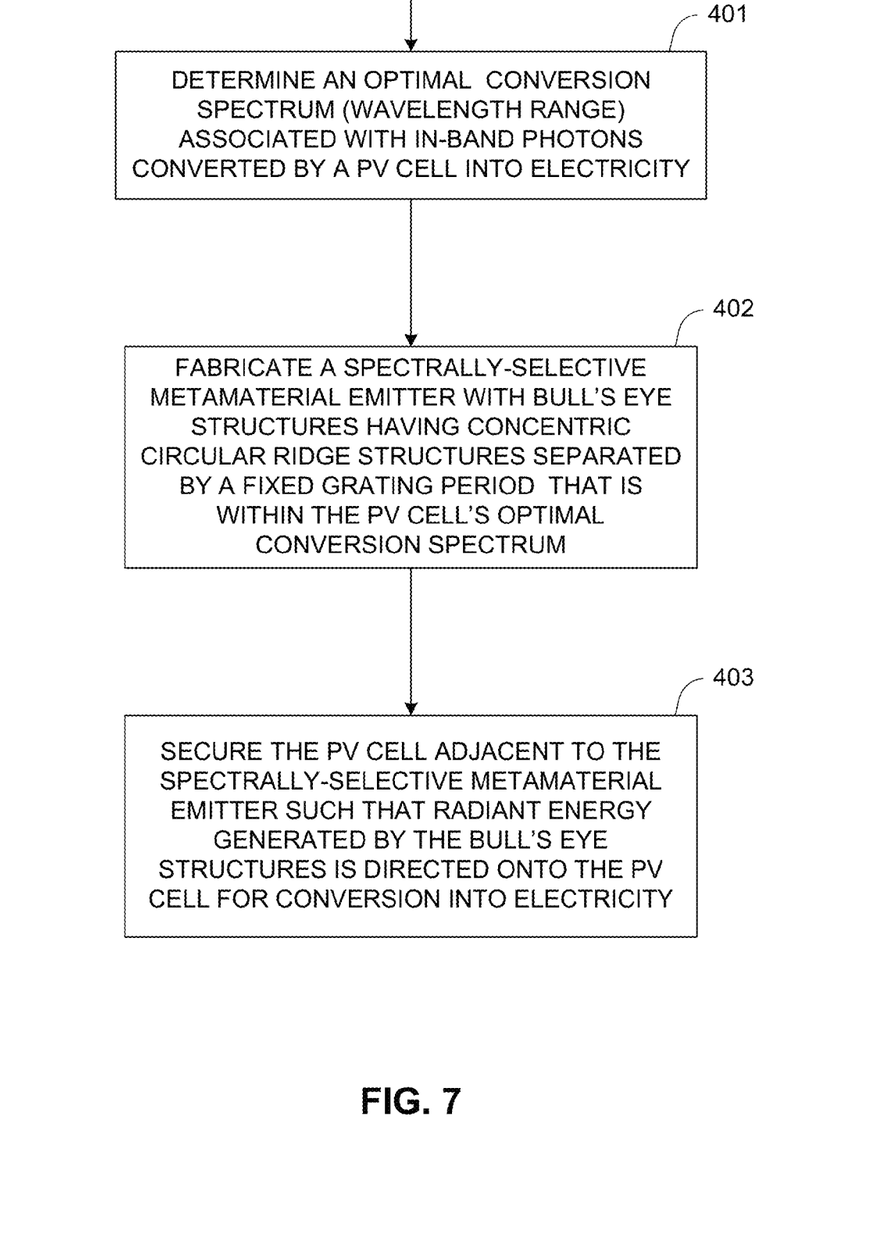
FIG. 7 is a flow diagram showing a generalized method for producing a TPV converter according to another embodiment of the present invention.

FIG. 7 is a flow diagram showing a generalized method for producing a TPV converter according to another embodiment of the present invention. The production method applies to any of the TPV converters described with reference to FIGS. 1 to 6(B), that is, including a spectrally-selective metamaterial emitter having one or more bull's eye structures and an associated PV cell.

Referring to the upper portion of FIG. 7 (block 401), the production method begins by determining the optimal conversion spectrum (e.g., from a previously generated EQE curve, or through testing) of the associated PV cell. As explained above, the optimal conversion spectrum identifies "in-band" photon wavelengths that are most efficiently converted by the associated PV cell into electricity, and varies by PV cell type.

As indicated in block 702 (FIG. 7), the production process then involves fabricating a spectrally-selective metamaterial emitter with bull's eye structures having concentric circular ridge structures separated by a fixed grating period that is roughly equal to the PV cell's optimal conversion spectrum. In an exemplary embodiment, this portion of the production process is carried out as set forth with reference to FIGS. 8(A) to 8(F), which illustrate fabricating a spectrally-selective metamaterial emitter using photolithographic processing techniques.

Figure 8A:
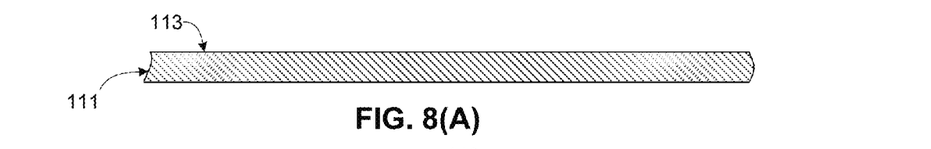
FIGS. 8(A), 8(B), 8(C), 8(D), 8(E) and 8(F) are simplified cross-sections illustrating a method for fabricating bull's eye structures according to a specific embodiment of the method of FIG. 7.
Figure 8B:
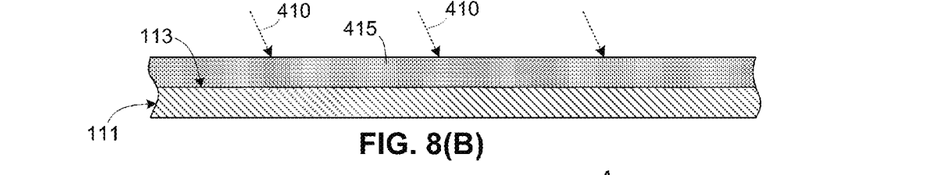
Figure 8C:
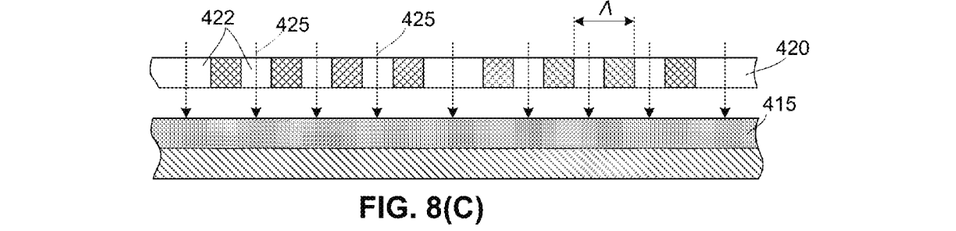
Figure 8D:
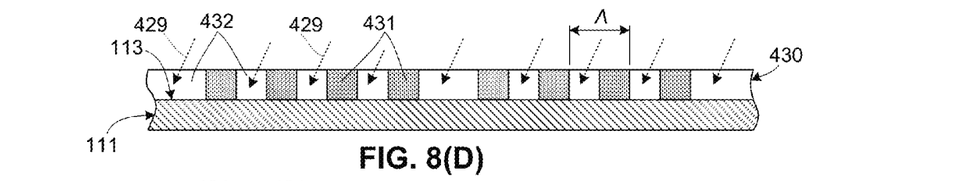

FIGS. 8(A) to 8(D) illustrate the use of photolithography to generate a patterned mask on a planar upper surface 113 of a solid base substrate 111 (shown in FIG. 8(A)). According to a preferred embodiment, base substrate 111 comprises one of the refractory metals (or alloys thereof) that are mentioned above. FIG. 8(B) shows the deposition of a photoresist 210 that forms a photoresist layer 215 on upper surface 113 of base substrate 111. FIG. 8(C) depicts the subsequent use of a reticle 220 to expose photoresist layer 215 using known techniques, but modified in that reticle includes an aperture pattern having a "mirror" shaped pattern corresponding to a "negative" of the desired bull's eye structures (i.e., including concentric circular apertures 222 set at a grating period in the range of 10 nanometers to 5 microns), whereby light 225 passing through apertures 222 develop corresponding concentric circular portions of photoresist layer 215. FIG. 8(D) show the subsequent removal of undeveloped photoresist (i.e., using a suitable etchant 229), thereby completing photoresist mask 230 including a plurality of concentric circular resist structures 231 having a fixed grating period Λ in the range of 0.5 to 5 microns, wherein each adjacent pair of concentric circular resist structures 231 are separated by an intervening concentric circular slot 232.

Figure 8E:
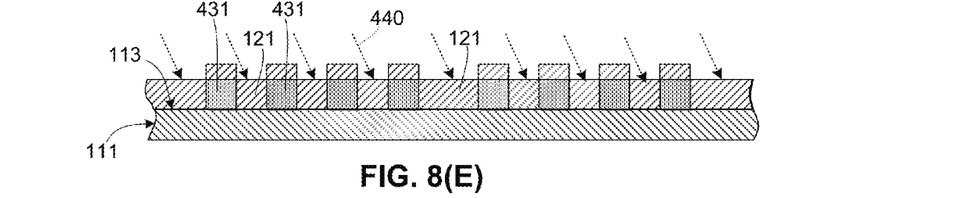

FIG. 8(E) depicts utilizing mask 230 to form a bull's eye structure on upper surface 113 according to a specific "additive" embodiment of the present invention. In this case, a refractory metal 240 (which can either be the same refractory metal as forming base substrate 111 or a different refractory metal) is deposited (e.g., by way of sputter deposition) over mask 230 and exposed portions of upper surface 113 that are exposed between concentric circular resist structures 231, thereby forming ridge structures 121 having the fixed grating period Λ between adjacent pairs of resist structures 231. In an alternative "subtractive" embodiment (not shown), mask 230 is utilized to form bull's eye structures by dry etching exposed portions of the base substrate through the mask slots, thereby forming the concentric grooves between corresponding circular ridge structures 121-2 that have a composition identical to that of the base substrate.

Figure 8F:
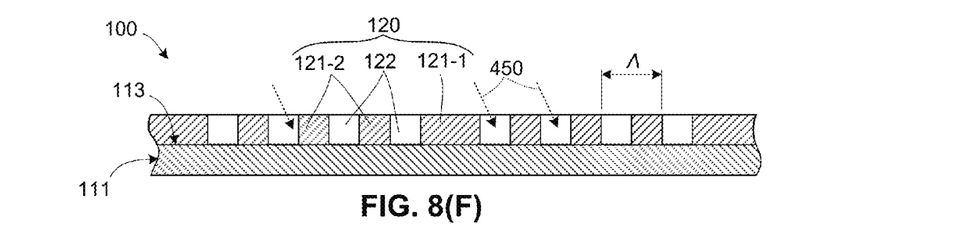

FIG. 8(F) depicts the subsequent removal of the photoresist mask using a suitable etchant 250 mask 230 from the planar upper surface 113, thereby completing the fabrication of metamaterial emitter 100 including a bull's eye structure 120 disposed on base substrate 111, where bull's eye structure 120 includes concentric circular ridge structures 121-2 separated by intervening circular grooves 122 and spaced at a grating period Λ in the range of 0.5 to 5 microns.

Returning to FIG. 7, once the bull's eye structure fabrication process described with reference to FIGS. 8(A) to 8(F) is completed, final construction of the metamaterial emitter is completed, and then (as indicated in block 403), the PV cell (or PV cells) are operably secured in a fixed relationship relative to the metamaterial emitter such that radiant energy generated by the bull's eye structures is directed onto the PV cell(s) for conversion into electricity. Final construction of the metamaterial emitter may include, for example, connecting the metal plate (base substrate) on which the bull's eye structures are formed into a box-like enclosure similar to those described above. Securing the PV cells may involve, for example, mounting the PV cells directly to the box-like enclosure, mounting the PV cells onto a water-cooled platform disposed adjacent to the metamaterial emitter, or at a suitable distance from the metamaterial emitter that minimizes heat damage of the PV cell.

Although the fabrication methodology described above with reference to FIGS. 8(A) to 8(F) depict the formation of a metamaterial emitter having a single bull's eye structure, it is understood that the method is expandable using known techniques to generate multiple bull's eye structures, such as the bull's eye structure sets depicted in FIGS. 3 and 4. In the case of the multiplexed bull's eye structures shown in FIG. 4, a reticle is produced in which a concentric circular pattern is repeated in an overlapping manner to form apertures having a multiplexed arrangement, and then the reticle is used to generate a patterned mask including concentric circular resist structures disposed in the multiplexed arrangement, and then using the process described above to form multiple pluralities of overlapping concentric circular metal ridge structures in the multiplexed arrangement.

Although the present invention has been described with respect to certain specific embodiments, it will be clear to those skilled in the art that the inventive features of the present invention are applicable to other embodiments as well, all of which are intended to fall within the scope of the present invention. For example, although the TPV converters described herein include metamaterial emitters having all-metal structures to maximize operational lifetime, TPV converters utilizing less robust metamaterial emitters (e.g., having metal bull's eyes structures formed on dielectric base substrates or all-semiconductor platforms) may be also used.

The invention claimed is:

1. A TPV converter comprising:
a metamaterial emitter including:
a box-like enclosure at least partially formed by a peripheral wall including spaced-apart first and second peripheral wall portions respectively having first and second inward-facing planar surfaces that face a rectangular-shaped interior cavity of the enclosure, and respectively having first and second outward-facing planar surfaces that face away from the interior cavity, said box-like enclosure including an inlet opening defined between first ends of said first and second peripheral wall portions and an outlet opening defined between second ends of said first and second peripheral wall portions, said box-like enclosure being operably shaped such that heat energy directed into said interior cavity through said inlet opening is channeled between said first and second peripheral wall portions at a rate that optimizes heat transfer to said first and second peripheral wall portions before exiting said interior cavity through said outlet opening,
at least one first bull's eye structure disposed on the first outward-facing surface of the first peripheral wall portion and including a plurality of first concentric circular ridge structures disposed in an associated first fixed grating period such that, when the metamaterial emitter is heated by said heat energy to a temperature above 1000° K, a first radiant energy beam is emitted from said one or more first bull's eye structures having a peak emission wavelength that is roughly equal to said first fixed grating period, and
at least one second bull's eye structure disposed on the second outward-facing surface of the second peripheral wall portion and including a plurality of second concentric circular ridge structures disposed in an associated second fixed grating period such that, when the metamaterial emitter is heated by said heat energy to said temperature above 1000° K, a second radiant energy beam is emitted from said one or more second bull's eye structures having a peak emission wavelength that is roughly equal to said second fixed grating period; and
first and second photovoltaic (PV) cells fixedly disposed outside of said interior cavity and adjacent to the spectrally-selective metamaterial emitter such that said first PV cell is positioned to receive said first radiant energy beam emitted from said first bull's eye structure, and such that said second PV cell is positioned to receive said second radiant energy beam emitted from said second bull's eye structure.

2. The TPV converter of claim 1, wherein said box-like enclosure comprises an all-metal structure.

3. The TPV converter of claim 2, wherein said box-like enclosure comprises one or more refractory metals.

4. The TPV converter of claim 2, wherein said box-like enclosure further comprises first and second compound parabolic trough structures respectively integrally connected to first end portions of said first and second peripheral wall portions.

5. The TPV converter of claim 4, wherein said box-like enclosure further comprises first and second funnel-shaped outlet structures respectively integrally connected to the second end portions of said first and second peripheral wall portions.

6. The TPV converter of claim 5, wherein the at least one bull's eye structure includes a first array of multiplexed bull's eye structures disposed on the first outward-facing surface of said first peripheral wall portion, and a second array of multiplexed bull's eye structures disposed on the second outward-facing surface of said second peripheral wall portion.

7. The TPV converter of claim 5,
wherein the first and second peripheral wall portions, the first and second compound parabolic trough structures and the first and second funnel-shaped outlet structures comprise a single refractory metal.

* * * * *